US010685830B2

(12) United States Patent
Delmas

(10) Patent No.: US 10,685,830 B2
(45) Date of Patent: Jun. 16, 2020

(54) CONDENSER SYSTEM FOR HIGH PRESSURE PROCESSING SYSTEM

(71) Applicant: Applied Materials, Inc., Santa Clara, CA (US)

(72) Inventor: Jean Delmas, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/183,967

(22) Filed: Nov. 8, 2018

(65) Prior Publication Data

US 2019/0157074 A1    May 23, 2019

Related U.S. Application Data

(60) Provisional application No. 62/587,916, filed on Nov. 17, 2017.

(51) Int. Cl.
| | |
|---|---|
| *H01L 21/02* | (2006.01) |
| *H01L 21/67* | (2006.01) |
| *B08B 3/02* | (2006.01) |
| *F16T 1/38* | (2006.01) |
| *F22B 29/08* | (2006.01) |

(52) U.S. Cl.
CPC .......... *H01L 21/02101* (2013.01); *B08B 3/02* (2013.01); *F16T 1/38* (2013.01); *F22B 29/08* (2013.01); *H01L 21/67034* (2013.01)

(58) Field of Classification Search
None
See application file for complete search history.

(56) References Cited

U.S. PATENT DOCUMENTS

| | | |
|---|---|---|
| 4,524,587 A | 6/1985 | Kantor |
| 5,050,540 A | 9/1991 | Lindberg |
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |

(Continued)

FOREIGN PATENT DOCUMENTS

| | | |
|---|---|---|
| CN | 101871043 A | 10/2010 |
| CN | 104089491 A | 10/2014 |

(Continued)

OTHER PUBLICATIONS

Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.

(Continued)

*Primary Examiner* — Rita P Adhlakha
(74) *Attorney, Agent, or Firm* — Patterson + Sheridan LLP

(57) ABSTRACT

Embodiments described herein relate to a high pressure processing system with a condenser and methods for utilizing the same. The processing system includes a process chamber, a boiler, a condenser, and one or more heat exchangers. The boiler generates a fluid, such as a vapor or supercritical fluid, and delivers the fluid to the process chamber where a substrate is processed. After processing the substrate, the system is depressurized and the fluid is delivered to the condenser where the fluid is condensed.

14 Claims, 1 Drawing Sheet

(56) References Cited

U.S. PATENT DOCUMENTS

| | | |
|---|---|---|
| 5,366,905 A | 11/1994 | Mukai |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Liang et al. |
| 8,466,073 B2 | 6/2013 | Wang et al. |
| 8,481,123 B2 | 7/2013 | Kim et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0269291 A1 | 12/2005 | Kent |
| 2006/0003596 A1 | 1/2006 | Fucsko et al. |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |

(56) References Cited

U.S. PATENT DOCUMENTS

| | | | |
|---|---|---|---|
| 2016/0064209 A1 | 3/2016 | Lee et al. | |
| 2016/0064482 A1 | 3/2016 | Hashemi et al. | |
| 2016/0076149 A1 | 3/2016 | Yamazaki et al. | |
| 2016/0111272 A1 | 4/2016 | Girard et al. | |
| 2016/0118391 A1 | 4/2016 | Zhao et al. | |
| 2016/0163540 A1 | 6/2016 | Liao et al. | |
| 2016/0208414 A1 | 7/2016 | Odawara et al. | |
| 2016/0260526 A1 | 9/2016 | Otto | |
| 2016/0273758 A1 | 9/2016 | Fujimura | |
| 2016/0274454 A1 | 9/2016 | Beasley et al. | |
| 2016/0334162 A1 | 11/2016 | Kim et al. | |
| 2016/0353522 A1 | 12/2016 | Rathi et al. | |
| 2017/0005204 A1 | 1/2017 | Hosoba et al. | |
| 2017/0011932 A1 | 1/2017 | Pethe et al. | |
| 2017/0104062 A1 | 4/2017 | Bi et al. | |
| 2017/0140996 A1 | 5/2017 | Lin et al. | |
| 2017/0160012 A1 | 6/2017 | Kobayashi et al. | |
| 2017/0194430 A1 | 7/2017 | Wood et al. | |
| 2017/0253968 A1 | 9/2017 | Yahata | |
| 2017/0263702 A1 | 9/2017 | Chan et al. | |
| 2017/0314125 A1 | 11/2017 | Fenwick et al. | |
| 2017/0358483 A1 | 12/2017 | Roy et al. | |
| 2018/0019249 A1 | 1/2018 | Zhang et al. | |
| 2018/0023192 A1 | 1/2018 | Chandra et al. | |
| 2018/0261480 A1 | 9/2018 | Liang et al. | |
| 2018/0350563 A1 | 12/2018 | Manna et al. | |
| 2019/0139793 A1* | 5/2019 | Delmas | H01L 21/67109 |
| 2019/0259625 A1 | 8/2019 | Nemani et al. | |

FOREIGN PATENT DOCUMENTS

| | | |
|---|---|---|
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

Shimoyama, Takehiro et al., "Porous Aluminum for Heat Exchanger", Hitachi Chemical, pp. 19-20.

Kato, T. et al., "Heat Transfer Characteristics of a Plate-Fin Type Supercritical/Liquid Helium Heat Exchanger", ICEC 14 Proceedings Supplement, 1992, pp. 260-263.

Lee, Ho-Saeng et al., "The cooling heat transfer characteristics of the supercritical CO2 in mico-fin tube", Springer, Oct. 2, 2012, pp. 173-184.

International Search Report and Written Opinion for PCT/US2019/014759 (APPM/44014994PC) dated May 14, 2019.

International Search Report and Written Opinion for PCT/US2019/015332 (APPM/44014895PC) dated May 15, 2019.

International Search Report and Written Opinion for PCT/US2018/059676 (APPM/25833PC) dated May 23, 2019.

International Search Report and Written Opinion for PCT/US2019/023431 (APPM/44015232PC) dated Jul. 5, 2019.

Haskel Pressure on Demand, Pneumatic and Hydraulic Driven Gas Boosters, Apr. 30, 2016, 36 pp.

Taiwan Office Action dated Jul. 3, 2019 for Application No. 107136181 (Appm/025417TW01).

International Search Report and Written Opinion dated Nov. 30, 2018 for Application No. PCT/US2018/041688 (APPM/25059WO01).

International Search Report and Written Opinion for PCT/US2018/043160 (APPM/25068PC) dated Jan. 31, 2019.

International Search Report and Written Opinion for PCT/US2018/059643 (APPM/25301PC) dated Feb. 26, 2019.

International Search Report and Written Opinion from PCT/US2019/012161 dated Apr. 30, 2019 (APPM/25703US).

International Search Report and Written Opinion for PCT/US2018/021715 dated Jun. 22, 2018.

International Search Report and Written Opinion from PCT/US2018/034036 (APPM/25104PC) dated Aug. 24, 2018.

International Search Report and Written Opinion dated Aug. 24, 2018 for Application No. PCT/US2018/034284 (APPM/025105PC).

International Search Report, Application No. PCT/US2018/028258 (APPM/25170PC) dated Aug. 9, 2018.

International Search Report and Written Opinion for PCT/US2018/035210 (APPM/25236PC) dated Aug. 24, 2018.

International Search Report and Written Opinion for PCT/US2018/037539 (APPM/24939PC) dated Oct. 5, 2018.

International Search Report and Written Opinion for PCT/US2018/038822 (APPM/24681PC) dated Oct. 26, 2018.

Office Action for Japanese Application No. 2018-546484 (APPM/023712JP01) dated Oct. 8, 2019.

International Search Report and Written Opinion for International Application No. PCT/US2019/029602 (APPM/44015258WO01) dated Aug. 14, 2019.

Taiwan Office Action dated Jun. 11, 2019 for Application No. 107138905 (APPM/25799TW).

Taiwan Office Action dated Nov. 19, 2019 for Application No. 108103415 (APPM/44014895TW01).

Office Action for Taiwan Patent Application No. 108111501 dated Nov. 14, 2019 (APPM/44015232TW).

Office Action for Japanese Application No. 2018-517285 (APPM/023357JP03) dated Oct. 23, 2019.

* cited by examiner

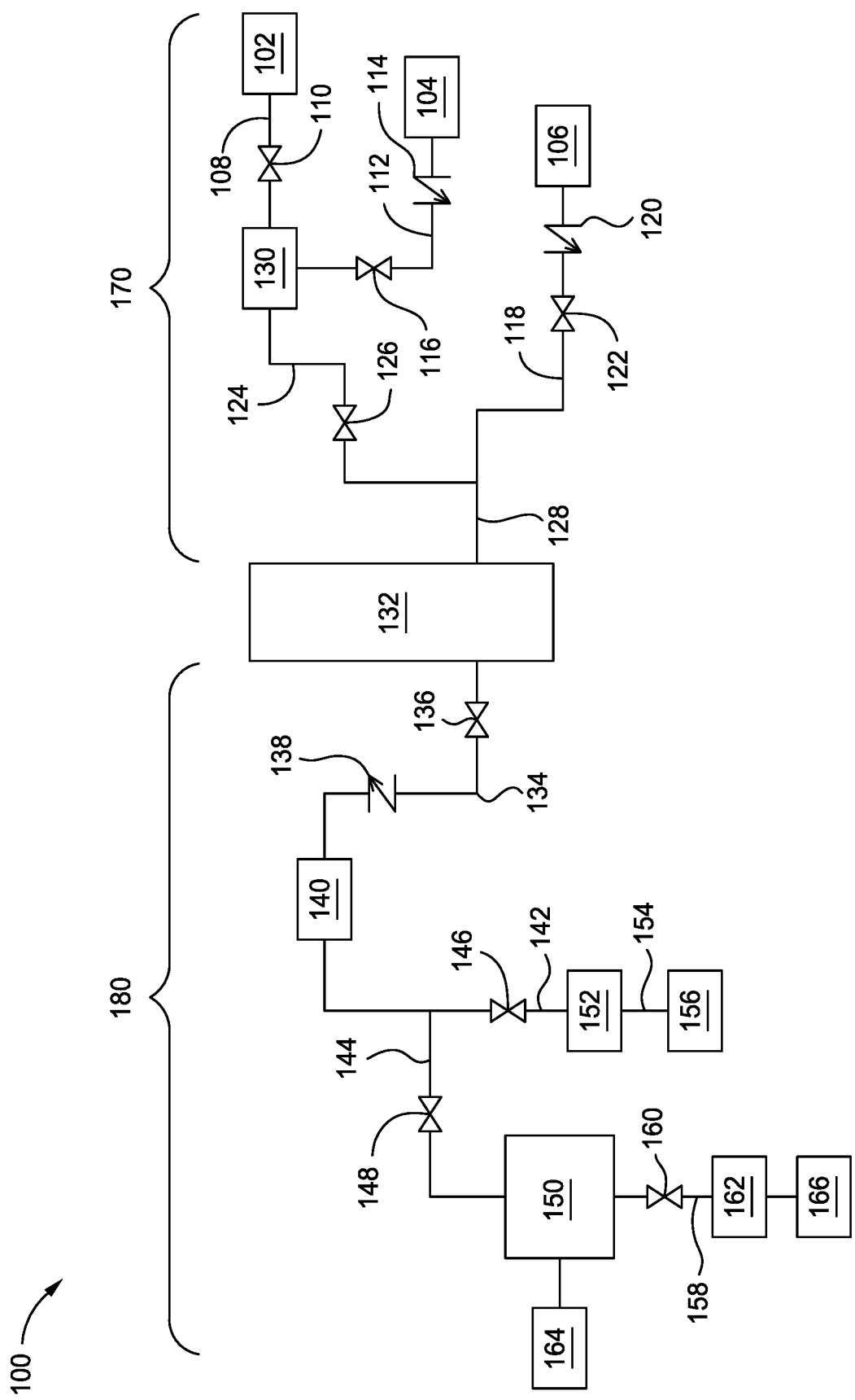

US 10,685,830 B2

CONDENSER SYSTEM FOR HIGH PRESSURE PROCESSING SYSTEM

CROSS-REFERENCE TO RELATED APPLICATIONS

This application claims benefit of U.S. Provisional Patent Application No. 62/587,916, filed Nov. 17, 2017, the entirety of which is hereby incorporated by reference.

BACKGROUND

Field

Embodiments of the present disclosure generally relate to a substrate processing apparatus. More specifically, embodiments described herein relate to a condenser system for a high pressure processing system.

Description of the Related Art

Conventional substrate processing systems often operate at reduced pressures during processing operations. Recent developments in certain processing technology, such as substrate cleaning, utilize high pressure environments compatible with steam or supercritical fluids. However, conventional apparatus are not equipped to accommodate the unique pressure regimes associated with supercritical fluid processing. Moreover, conventional apparatus cannot easily be retrofitted to accommodate high pressure operating environments without the unnecessary risk of catastrophic apparatus failure.

Thus, what is needed in the art is a condenser system for a high pressure processing system.

SUMMARY

In one embodiment, a substrate process system is provided. The system includes a process chamber, a boiler in fluid communication with the process chamber via a first conduit, and a first valve disposed on the first conduit between the boiler and the process chamber. A condenser is in fluid communication with the process chamber via a second conduit and a second valve is disposed on the second conduit between the condenser and the process chamber. A heat exchanger is in fluid communication with the condenser via a third conduit and a third valve is disposed on the third conduit between the condenser and the heat exchanger.

In another embodiment, a substrate processing system is provided. The system includes a process chamber, a boiler in fluid communication with the process chamber via a first conduit, and a first valve disposed on the first conduit between the boiler and the process chamber. A condenser is in fluid communication with the process chamber and a second valve is disposed on the second conduit between the condenser and the process chamber. A first heat exchanger is disposed on the second conduit between the process chamber and the condenser and a fluid collection unit is in fluid communication with the condenser via a third conduit. A second heat exchanger is disposed on the third conduit between the condenser and the fluid collection unit and a third valve is disposed on the third conduit between the condenser and the second heat exchanger.

In yet another embodiment, a substrate process method is provided. The method includes heating conduits extending from a process chamber and heating a boiler in fluid communication with the process chamber. Valves disposed on conduits located upstream from the process chamber are closed and valves disposed on conduits located downstream from the process chamber are opened. A substrate is positioned in the process chamber, the process chamber is heated, the valves disposed on conduits located downstream from the process chamber are closed, and the valves disposed on conduits located upstream from the process chamber are opened to enable a fluid generated by the boiler to pressurize the process chamber. The valves disposed on conduits locate downstream from the process chamber are opened and the fluid from the process chamber is flowed to a condenser.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1 is a schematic illustration of a high pressure processing system with a condenser according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a high pressure processing system with a condenser and methods for utilizing the same. The processing system includes a process chamber, a boiler, a condenser, and one or more heat exchangers. The boiler generates a fluid, such as a vapor or supercritical fluid, and delivers the fluid to the process chamber where a substrate is processed. After processing the substrate, the system is depressurized and the fluid is delivered to the condenser where the fluid is condensed.

FIG. 1 is a schematic illustration of a high pressure processing system 100 with a condenser 150 according to an embodiment described herein. The system 100 includes a process chamber 132, a boiler 130, one or more heat exchangers 140, 152, 162, and the condenser 150. The boiler 130 is disposed in an upstream region 170 from the process chamber 132 and the heat exchangers 140, 152, 162 and condenser 150 are disposed in a downstream region 180 from the process chamber 132.

The system 100 also includes a plurality of fluid sources 102, 104, 106. In one embodiment, the fluid source 102 is a process liquid source, for example, a water source; the fluid source 104 is a process gas source, for example, a $CO_2$ gas source or a $NH_3$ gas source; and the fluid source 106 is a purge gas source, for example, an inert gas source, such as an argon gas or nitrogen gas source.

The fluid source 102 is in fluid communication with the boiler 130 via a conduit 108. A valve 110 is disposed on the conduit 108 between the fluid source 102 and the boiler 130 to control fluid flow between the fluid source 102 and the boiler 130. The fluid source 104 is in fluid communication with the boiler 130 via a conduit 112. A valve 116 is disposed on the conduit 112 between the fluid source 104 and the boiler 130 to control fluid flow between the fluid source 104 and the boiler 130. A check valve 114, such as a unidirectional flow valve, is also disposed on the conduit 112 between the valve 116 and the fluid source 104 to prevent backflow of fluid from the boiler to the fluid source 104.

In operation, the boiler 130 receives fluid from one or both of the fluid sources 102, 104 and heats and/or pressurizes the process fluids to form vapors and/or supercritical fluids. The fluid is flowed from the boiler 130 through a conduit 124 to a conduit 128 which is in fluid communication with the process chamber 132. A valve 126 is disposed on the conduit 124 between the conduit 128 and the boiler 130 to control fluid flow between the boiler 130 and the process chamber 132.

The fluid source 106 is in fluid communication with the process chamber 132 via a conduit 118 and the conduit 128 which is coupled to the process chamber. A valve 122 is disposed on the conduit 118 between the fluid source 106 and the conduit 128 to control fluid flow between the fluid source 106 and the process chamber 132. A check valve 120, such as a unidirectional flow valve, is also disposed on the conduit 118 between the valve 122 and the fluid source 106 to prevent backflow of fluid between the process chamber 132 and the fluid source 106.

A portion of each of the conduits 108, 112, 118 disposed downstream from the valves 110, 116, 122, respectively, are condensation controlled. For example, those portions are jacketed and heated to prevent condensation of fluid flowing through the portions. Alternatively, those portions are p-trapped to collect condensation from fluid flowing through the portions. Conduits 124, 128 are also condensation controlled. Similar to the conduits 108, 112, 118, the conduits 124, 128 may be jacketed and heated and/or p-trapped to substantially prevent or collect condensation of fluid flowing through the conduits 124, 128.

The process chamber 132 is configured as a high pressure/high temperature vessel capable of operating at pressures utilized to maintain vapors and/or supercritical fluids for substrate processing. In one embodiment, the process chamber 132 is a single substrate process chamber. In another embodiment, the process chamber 132 is a batch process chamber for processing multiple substrates at one time. The process chamber 132 may also be configured for performing various substrate processing operations, such as substrate cleaning or the like. In one example, the process chamber 132 is configured for performing a supercritical substrate cleaning process.

Disposed in the downstream region 180 from the process chamber 132, the condenser 150 is in fluid communication with the process chamber 132. A conduit 134 extends from the process chamber 132 to a heat exchanger 140. A valve 136 is disposed on the conduit 134 between the process chamber 132 and the heat exchanger 140 to control fluid flow between the process chamber 132 and the heat exchanger 140. A check valve 138, such as a unidirectional valve, is disposed on the conduit 134 between the valve 136 and the heat exchanger 140 to prevent backflow of fluid from the heat exchanger 140 into the process chamber 132.

The heat exchanger 140 is utilized to cool fluid flowing from the process chamber 132. Fluids cooled by the heat exchanger 140 flow through a conduit 144 to the condenser 150. A heat exchanger 152 is also in fluid communication with the heat exchanger 140 via a conduit 142 which is coupled to the conduit 144. The conduit 142 is coupled to the conduit 144 between the condenser 150 and the heat exchanger 140.

A valve 148, such as a throttle valve or the like, is disposed on the conduit 144 between the condenser 150 and the conduit 142 to control fluid flowing to the condenser 150 from the heat exchanger 140. A valve 146 is disposed on the conduit 142 between the conduit 144 and the heat exchanger 152. When the valve 148 is closed and the valve 146 is opened, fluid flows from the heat exchanger 140 to the heat exchanger 152. A fluid flow path incorporating the heat exchanger 152 is utilized for further cooling and pressurization of gases exiting the heat exchanger 140.

A conduit 154 extends from the heat exchanger 152 to an exhaust 156. Cooled gases at pressures reduced from those utilized in the process chamber 132 are diverted prior to reaching the condenser 150. The exhaust 156 removes the gases from the system 100, for example, by delivering the gases to a facility exhaust.

The conduit 134 is condensation controlled. In one embodiment, the conduit 134 is jacketed and heated to prevent condensation of fluid flowing from the process chamber 132 to the heat exchanger 140. Alternatively, the conduit 134 is p-trapped to collect condensation from fluid flowing from the process chamber 132 to the heat exchanger 140. Similar to the conduit 134, the conduit 142 is also condensation controlled. A portion of the conduit 144 between the heat exchanger 140 and the valve 148 is similarly condensation controlled. By condensation controlling the aforementioned conduits 134, 142, 144 premature condensation of fluid flowing from the process chamber 132 to the condenser 150 is avoided or substantially reduced.

The condenser 150 is a temperature and pressure controlled vessel which condenses fluid received from the process chamber 132 to make collection of the fluid as a liquid more efficient. By condensing the fluid to a liquid, the fluid may be filtered and reutilized in subsequent substrate processing operations. In one embodiment, the condenser 150 includes physical features for increasing the surface area of material exposed to the fluid in the condenser 150. In one example, a porous scaffolding or porous filter is disposed within the condenser to increase the surface area over which the fluid flows within the condenser 150. For example, the porous scaffolding or porous filter is formed from a sintered metal material. In another embodiment, extended and/or tortured fluid flow pathways are disposed within the condenser 150 to further facilitate more efficient fluid condensation.

In one embodiment, the condenser 150 includes a heat sink to further cool fluid delivered to the condenser 150. The heat sink may be temperature controlled to encourage condensation of the fluid on the heat sink. In one embodiment, the heat sink is finned to increase the surface area within the condenser 150 to facilitate condensation. In various embodiments, the structures of the condenser 150 and the heat sink are temperature controlled to be below the condensation temperature of the fluid to be condensed within the condenser 150. It is also contemplated that as condensation progresses, pressure within the condenser drops which may be utilized to facilitate flow of the condensed fluid from the condenser 150.

A level sensor 164 is operably coupled to the condenser 150. The level sensor 164, such as a float or the like, determines an amount of condensed fluid within the condenser 150. In one embodiment, data derived from the level sensor 164 regarding the amount of fluid in the condenser 150 is utilized to operate a valve 160 which controls fluid flow from the condenser 150 via a conduit 158 to a fluid collection unit 166. The fluid collection unit 166 collects condensed fluid form the condenser 150 and may optionally filter the fluid to prepare the fluid for reuse. A heat exchanger 162 is also disposed on the conduit 158 between the fluid collection unit 166 and the valve 160 to further cool the condensed fluid prior to delivering the fluid to the fluid collection unit 166.

In operation, a fluid is heated and/or pressurized in the boiler 130 and delivered to the process chamber 132 to process a substrate disposed therein. After processing of the substrate, the fluid is delivered to the condenser 150 to condense and collect the condensed fluid in a fluid collection unit 166. Various examples of fluid processing regimes utilizing the apparatus 100 are described in detail below.

Pressure within the system 100 is controlled by a temperature of the boiler 130. In this embodiment, valve 136 is closed and valve 126, which may be a throttle valve, is opened. A temperature of the boiler 130 is set such that a pressure of the boiler 130 is greater than a temperature of the process chamber 132. In this embodiment, valve 126 functions as a pressure regulator and valve 136 functions as a pressure bleed from the process chamber 132 if a pressure of the process chamber 132 is above a predetermined threshold. In another embodiment, valve 126 functions as a flow limiting valve and valve 136 functions as a back pressure regulator to facilitate pressure control within the process chamber 132. The embodiments, described above may be implemented with or without active flow of fluid through the system, depending upon the desired implementation.

In one embodiment, water is utilized to form a process fluid. In operation, the process chamber 132 is opened by closing valve 126 and opening valve 136 and valve 160. The condensation controlled conduits described above are heated to a temperature of between about 275° C. and about 300° C. The boiler 130 is pressurized to about 50 bar and heated to a temperature suitable to facilitate formation of water vapor. A substrate is positioned in the process chamber 132, the process chamber 132 is closed, and the process chamber 132 purged by opening valve 122 to deliver purge gas from the fluid source 106. After purging, valve 122 is closed.

The process chamber 132 is heated to a temperature of between about 450° C. and about 500° C. and valve 136 and valve 160 are closed prior to, during, or after heating of the process chamber 132. Valve 126 is opened to pressurize the process chamber 132 by delivery of the process fluid. As a result, the pressure and temperature of the boiler 130 will be reduced. Valve 126 is then closed while the boiler 130 recovers and valve 126 is reopened when the pressure of the boiler 130 is about equal to the pressure of the process chamber 132.

Valve 126 is closed when the pressure within the process chamber 132 is between about 40 bar and about 50 bar. The substrate is processed for a predetermined amount of time and then valve 136 is opened to depressurize the process chamber 132. The process fluid is condensed in the condenser 150 which is maintained at a temperature of between about 50° C. and about 80° C. and a pressure of about 1 ATM. When the pressure within the process chamber 132 has stabilized, valve 160 is opened and the condensed fluid is delivered to the fluid collection unit 166. When the process chamber 132 has cooled, the processed substrate is then removed.

In another embodiment, $CO_2$ is utilized to form a process fluid. In operation, the process chamber 132 is "opened" by closing valve 126 and opening valve 136 and valve 160. The condensation controlled conduits described above are heated to a temperature of between about 30° C. and about 100° C. The condenser 150 is controlled at a temperature of between about 8° C. and about 10° C. The boiler 130 is heated to a temperature of about 100° C. and maintained at a pressure suitable to facilitate formation of supercritical $CO_2$. A substrate is positioned in the process chamber 132, the process chamber 132 is closed, and the process chamber 132 purged by opening valve 122 to deliver purge gas from the fluid source 106. After purging, valve 122 is closed.

The process chamber 132 pressurized to about 80 bar, heated to a temperature of between about 100° C., and valve 136 and valve 160 are closed. Valve 126 is opened to pressurize the process chamber 132 by delivery of the process fluid. As a result, the pressure and temperature of the boiler 130 will be reduced. Valve 126 is then closed while the boiler 130 recovers and valve 126 is reopened when the pressure of the boiler 130 is about equal to the pressure of the process chamber 132.

Valve 126 is closed when the pressure within the process chamber 132 is between about 80 bar and about 100 bar. The substrate is processed for a predetermined amount of time and then valve 136 is opened to depressurize the process chamber 132. The heat exchanger 140 reduces the temperature of fluid flowing from the process chamber 132 from a temperature of about 100° C. to a temperature of about 50° C. The process fluid is condensed in the condenser 150 which is maintained at a temperature of between about 8° C. and about 10° C. and a pressure of about 45 bar. When the pressure within the process chamber 132 has stabilized, valve 160 is opened and the condensed fluid is delivered to the fluid collection unit 166. One or both of conduits 142 and 154 are opened to remove gas and further depressurize the system 100. When the process chamber 132 has cooled, the processed substrate is then removed.

In another embodiment, $NH_3$ is utilized to form a process fluid. In operation, the process chamber 132 is "opened" by closing valve 126 and opening valve 136 and valve 160. The condensation controlled conduits described above are heated to a temperature of about 50° C. The condenser 150 is controlled at a temperature of −20° C. The boiler 130 is heated to a temperature of about 45° C. and maintained at a pressure suitable to facilitate formation of supercritical $NH_3$. A substrate is positioned in the process chamber 132, the process chamber 132 is closed, and the process chamber 132 purged by opening valve 122 to deliver purge gas from the fluid source 106. After purging, valve 122 is closed.

The process chamber 132 pressurized to about 10 bar, heated to a temperature of about 500° C., and valve 136 and valve 160 are closed. Valve 126 is opened to pressurize the process chamber 132 by delivery of the process fluid. As a result, the pressure and temperature of the boiler 130 will be reduced. Valve 126 is then closed while the boiler 130 recovers and valve 126 is reopened when the pressure of the boiler 130 is about equal to the pressure of the process chamber 132.

Valve 126 is closed when the pressure within the process chamber 132 is between about 10 bar. The substrate is processed for a predetermined amount of time and then valve 136 is opened to depressurize the process chamber 132. The heat exchanger 140 reduces the temperature of fluid flowing from the process chamber 132 from a temperature of about 500° C. to a temperature of about 50° C. The process fluid is condensed in the condenser 150 which is maintained at a temperature of about −20° C. and a pressure of about 2 bar. When the pressure within the process chamber 132 has stabilized, valve 160 is opened and the condensed fluid is delivered to the fluid collection unit 166. One or both of conduits 142 and 154 are opened to remove gas and further depressurize the system 100. When the process chamber 132 has cooled, the processed substrate is then removed.

While the foregoing is directed to embodiments of the present disclosure, other and further embodiments of the disclosure may be devised without departing from the basic scope thereof, and the scope thereof is determined by the claims that follow.

What is claimed is:

1. A substrate processing system, comprising:
    a process chamber;
    a boiler in fluid communication with the process chamber via a first conduit;
    a first valve disposed on the first conduit between the boiler and the process chamber;
    a condenser in fluid communication with the process chamber via a second conduit;
    a second valve disposed on the second conduit between the condenser and the process chamber;
    a heat exchanger in fluid communication with the condenser via a third conduit; and
    a third valve disposed on the third conduit between the condenser and the heat exchanger, further comprising a second heat exchanger disposed on the second conduit between the process chamber and the condenser.

2. The system of claim 1, wherein the process chamber is a single substrate process chamber.

3. The system of claim 1, wherein the process chamber is a batch substrate process chamber.

4. The system of claim 1, wherein the boiler is in fluid communication with one or more of a water source, a carbon dioxide source, or an ammonia source.

5. The system of claim 1, wherein the second valve is disposed on the second conduit between the process chamber and the second heat exchanger.

6. The system of claim 5, wherein a check valve is disposed on the second conduit between the second heat exchanger and the second valve.

7. The system of claim 1, further comprising:
    a third heat exchanger disposed on a fourth conduit which extends from the second conduit.

8. The system of claim 7, wherein a fourth valve is disposed on the fourth conduit between the second heat exchanger and the third heat exchanger.

9. The system of claim 1, wherein the condenser includes a heat sink.

10. The system of claim 1, further comprising:
    a level sensor in operable communication with the condenser.

11. The system of claim 1, wherein each of the first conduit and second conduit are insulated or actively heated.

12. A substrate processing system, comprising:
    a process chamber;
    a boiler in fluid communication with the process chamber via a first conduit;
    a first valve disposed on the first conduit between the boiler and the process chamber;
    a condenser in fluid communication with the process chamber via a second conduit;
    a second valve disposed on the second conduit between the condenser and the process chamber;
    a first heat exchanger disposed on the second conduit between the process chamber and the condenser;
    a fluid collection unit in fluid communication with the condenser via a third conduit;
    a second heat exchanger disposed on the third conduit between the condenser and the fluid collection unit; and
    a third valve disposed on the third conduit between the condenser and the second heat exchanger.

13. The system of claim 12, further comprising:
    a third heat exchanger disposed on a fourth conduit which extends from the second conduit.

14. The system of claim 13, wherein a fourth valve is disposed on the fourth conduit between the first heat exchanger and the third heat exchanger.

* * * * *